United States Patent
Yu et al.

(10) Patent No.: US 7,590,186 B2
(45) Date of Patent: Sep. 15, 2009

(54) ORTHOGONAL FREQUENCY DIVISION MULTIPLEXING (OFDM) SYSTEM RECEIVER USING LOW-DENSITY PARITY-CHECK (LDPC) CODES

(75) Inventors: Xiaonyong Yu, Grayslake, IL (US); Michael N. Kloos, Belvidere, IL (US); Alan P. Rottinghaus, Barrington, IL (US)

(73) Assignee: Motorola, Inc., Schaumburg, IL (US)

( * ) Notice: Subject to any disclaimer, the term of this patent is extended or adjusted under 35 U.S.C. 154(b) by 595 days.

(21) Appl. No.: 11/388,061

(22) Filed: Mar. 23, 2006

(65) Prior Publication Data

US 2007/0223602 A1    Sep. 27, 2007

(51) Int. Cl.
*H04L 5/12* (2006.01)
(52) U.S. Cl. .................................................... 375/261
(58) Field of Classification Search ................. 375/260, 375/261, 340; 708/531; 714/752, 758, 800
See application file for complete search history.

(56) References Cited

U.S. PATENT DOCUMENTS

| | | | |
|---|---|---|---|
| 2005/0229090 A1 | 10/2005 | Shen et al. | |
| 2005/0246606 A1 | 11/2005 | Cameron et al. | |
| 2005/0268202 A1 | 12/2005 | Molisch et al. | |
| 2007/0260966 A1* | 11/2007 | Kim et al. ................... | 714/800 |

* cited by examiner

*Primary Examiner*—Don N Vo

(57) ABSTRACT

Arrangements relating to an Orthogonal Frequency Division Multiplexing (OFDM) receiver (200) can include performing at least one Low-Density Parity Check (LDPC) decoding attempt on a received signal (725) and evaluating at least one parity check for each LDPC decoding attempt (735). Failed LDPC decoding attempts can be counted according to the evaluated parity checks (740). The signal can be selectively processed through at least one joint demodulation-decoding loop according to the counting of failed LDPC decoding attempts (745).

14 Claims, 4 Drawing Sheets

ORTHOGONAL FREQUENCY DIVISION MULTIPLEXING (OFDM) SYSTEM RECEIVER USING LOW-DENSITY PARITY-CHECK (LDPC) CODES

BACKGROUND OF THE INVENTION

1. Field of the Invention

The present invention generally relates to communication systems and, more particularly, to Orthogonal Frequency Division Multiplexing (OFDM) communication systems that utilize Low-Density Parity-Check codes.

2. Background of the Invention

Orthogonal Frequency Division Multiplexing (OFDM) is a digital transmission technique in which a signal is split into several narrowband channels at different frequencies. When modulating and demodulating signals, OFDM gives priority to minimizing the interference among the channels and symbols of the data stream. In this regard, some sort of Forward Error Correction (FEC) typically is used in conjunction with OFDM. In telecommunications, for example, FEC refers to a system of error control for data transmission where the receiving device has the capability to detect and correct fewer than a predetermined number or fraction of bits or symbols corrupted by transmission errors. FEC is implemented by adding redundancy to the transmitted information using some sort of coding or algorithm.

One type of OFDM receiver that employs FEC incorporates Low-Density Parity-Check (LDCP) codes. FIG. 1 is a block diagram that depicts a conventional OFDM communication system 100 utilizing LDPC as a means of FEC. An LDPC code is an error correcting code that provides a more reliable method of transmitting a message over a noisy transmission channel. LDPC uses a sparse parity-check matrix that is randomly generated and subject to sparsity constraints.

The system 100 can include a transmitter 105 which sends wireless signals via a channel 110 to a receiver 115. The transmitter 105 includes an LDPC encoder 120 which encodes bits of information. The encoded information bits are interleaved and mapped to Quadrature Amplitude Modulation (QAM) symbols in module 125. As known, interleaving generally scrambles the sequential order of the data stream according to a known pattern. The data stream can be interleaved with respect to time, frequency, or both time and frequency.

The resulting QAM symbols generated in module 125 are processed using an Inverse Fast Fourier Transform (IFFT) in module 130 to generate an OFDM symbol. Module 130 further adds a cyclic prefix to each OFDM symbol. The resulting signal can be transmitted via channel 110, i.e., as a wireless signal.

The receiver 115 includes a timing module 135 which selects samples to be processed using a Fast Fourier Transform (FFT) in module 140. The resulting signal is demodulated in demodulator 145. Functions including, but not limited to, channel estimation, equalization, automatic frequency control (AFC), and bit-log-likelihood ratio (LLR) generation also can be performed in demodulator 145. The bit-LLRs are de-interleaved, or descrambled, in de-interleave module 150. The de-interleave module 150 effectively reverses the interleaving process performed by module 125 to recover the proper data order. The resulting signal is provided to the LDPC decoder 155 where information bits are recovered.

OFDM communication system 100 only makes use of pilot symbols for the channel estimation process. As a result, when the channel is noisy, the channel error performance of communication system 100 with respect to data transmissions is sub-optimal notwithstanding the use of LPDC codes. Therefore, a need exists for a method and apparatus that provides for improved reliability for transmission of data over a noisy transmission channel in an OFDM communication system.

SUMMARY OF THE INVENTION

The present invention relates to an Orthogonal Frequency Division Multiplexing (OFDM) communication system. In one arrangement, the invention can include a method of signal processing in an OFDM receiver. The method can include performing at least one Low-Density Parity Check (LDPC) decoding attempt on a received signal and evaluating at least one parity check for each LDPC decoding attempt. Failed LDPC decoding attempts can be counted. Accordingly, the signal can be selectively processed through one or more joint demodulation-decoding loops according to the counting of failed LDPC decoding attempts.

In another arrangement, the invention can include an OFDM receiver. The receiver can include a pre-processor that performs a frequency analysis upon selected samples of a received signal and a forward processing stage that performs iterative LDPC decoding on the received signal. The OFDM receiver also can include a feedback processing stage that is selectively enabled according to whether a parity check performed in the first processing stage is passed.

Yet another arrangement of the present invention can include a machine readable storage being programmed to cause a machine to perform the various steps described herein.

BRIEF DESCRIPTION OF THE DRAWINGS

Preferred embodiments of the present invention will be described below in more detail, with reference to the accompanying drawings, in which.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The present invention relates to Orthogonal Frequency Division Multiplexing (OFDM) communication systems that utilize Low-Density Parity-Check (LDPC) codes. More particularly, the arrangements disclosed herein provide an OFDM receiver architecture which utilizes a nested loop configuration for performing joint demodulation-decoding. An indicator, such as an LDPC decoding parity check status, can be used to control the looping process.

Figure 1:
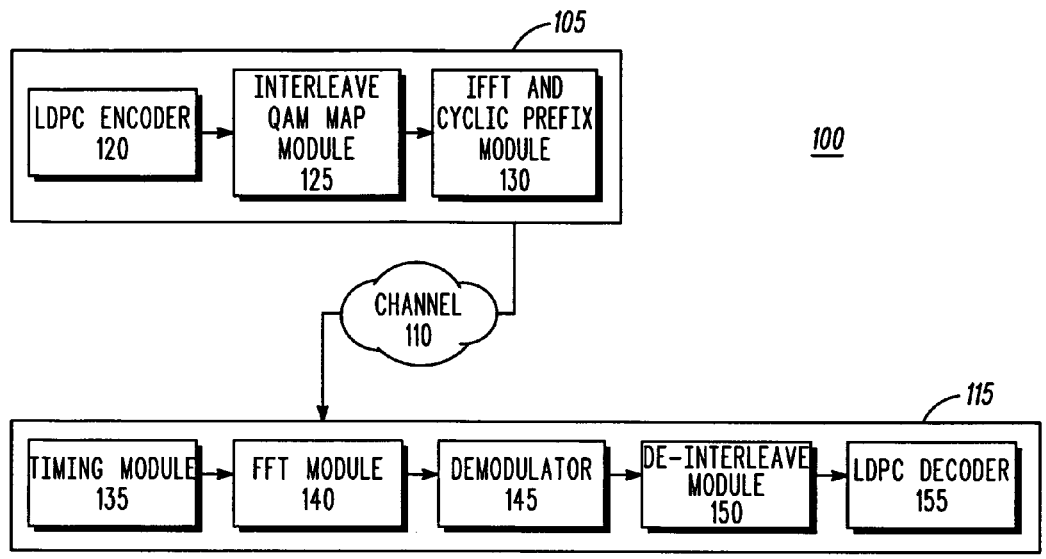
FIG. 1 is a block diagram that depicts a conventional Orthogonal Frequency Division Multiplexing (OFDM) communication system that utilizes Low-Density Parity-Check (LDPC) codes.
Figure 2:
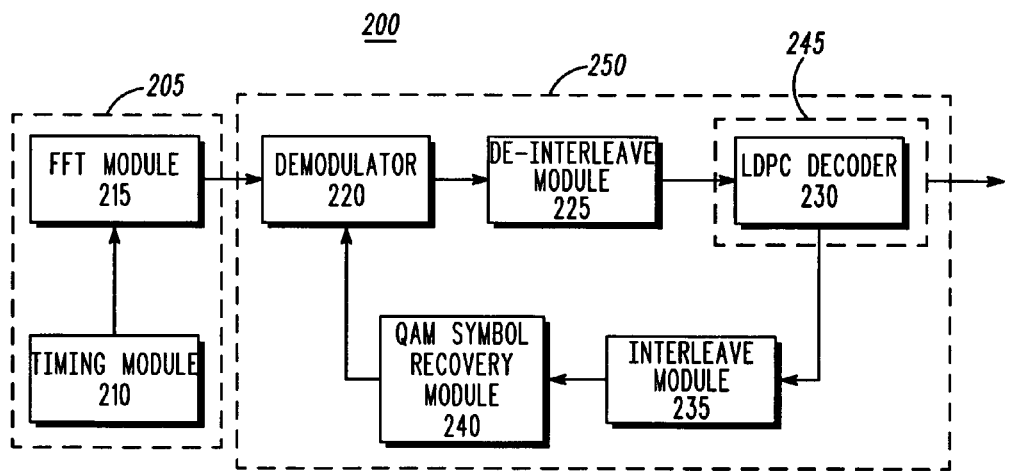
FIG. 2 is a block diagram that depicts an OFDM receiver architecture that is useful for understanding the present invention.

FIG. 2 is a block diagram that depicts an OFDM receiver 200 that is useful for understanding the present invention. As shown, the receiver 200 can include a pre-processing module 205 which includes a timing module 210 and a Fast Fourier Transform (FFT) module 215. The receiver 200 also can include a demodulator 220, a de-interleave module 225, an LDPC decoder 230, an interleave module 235 and a Quadrature Amplitude Modulation (QAM) symbol recovery module 240. Such components/subsystems 220-240 can be coupled to one another as shown. It should be appreciated that the various components and/or subsystems of receiver 200 can be implemented using computer programs executing within suitable digital signal processors, one or more discreet components, one or more programmable logic devices, or any combination thereof.

The receiver 200 can comprise at least two nested loops. A first loop 245, called the LDPC decoding loop, can refer to the iterative LDPC decoding process as implemented by the LDPC decoder 230. A second loop 250, referred to as the joint demodulation-decoding loop, can be characterized by a forward processing stage that includes the demodulator 220, the de-interleave module 225, and the LDPC decoder 230 and a feedback processing stage that includes the interleave module 235 and the QAM symbol recovery module 240. The interleave module 235 can receive signals from the LDPC decoder 230 and the QAM symbol recovery module 240 can direct signals back into the demodulator 220, the de-interleave module 225, and eventually to the LDPC decoder 230, thereby completing the second loop 250.

The timing module 210 can select samples which are processed using an FFT in FFT module 215. The demodulator 220 can demodulate the received signal. As noted, the demodulator 220 also can be configured to perform functions including, but not limited to, channel estimation, equalization, automatic frequency control (AFC), and bit-log-likelihood ratio (LLR) generation. The decoded signal, which is formed of soft symbols, can be provided to de-interleave module 225. The de-interleave module 225 can descramble, or effectively apply the reverse of the interleave process originally applied in the transmitter. The de-interleaved signal then can be provided to LDPC decoder 230, which can attempt to recover information bits from the de-interleaved data stream.

In operation, the first pass through receiver 200, as described above, can be performed substantially the same as in a conventional OFDM receiver. For each LDPC decoding iteration performed by the LDPC decoder 230, however, the LDPC decoder 230 can calculate parity check equations. A passing parity check, referring to the case where all parity check equations are evaluated to be true, can indicate that decoding was successful. In one arrangement, a parity check can be performed by evaluating a result of a logical OR of all modified inbound messages to a check node. If successful, the LDPC decoding loop 245 can be broken and bits can be provided from LDPC decoder 230 as output from receiver 200.

While successful LDPC decoding does not guarantee that the decoded code block is error free, such a condition does indicate that the error probability is low. The probability of error is an inverse exponential function of code block length for a well-designed LDPC code. In any case, this variety of error can be detected by a Cyclic Redundancy Check (CRC), which can be implemented as a type of hash function that produces a checksum against a larger block of data, i.e., a packet of network traffic or a block of a computer file. The error can be handled using an upper-layer Automatic Repeat-request (ARQ) function. An ARQ function refers to an error control technique for data transmission in which the receiver detects transmission errors in a message and automatically requests a retransmission from the transmitter.

The process of decoding within the receiver 200 can continue until such time that the parity check passes or a predetermined number of LDPC decoding iterations is performed. If the predetermined number of LDPC decoding iterations is reached and the parity check still fails, the second loop 250 can be engaged.

When the second loop 250 is engaged, soft decisions of whole code words can be provided as feedback from the LPDC decoder 230 to the interleave module 235. The interleave module 235 can interleave the signal by performing an inverse of the de-interleave function performed by De-Interleave module 225 and provides the resulting interleaved signal to the QAM symbol recovery module 240. The QAM symbol recovery module 240 can produce hard decisions of QAM symbols associated with received code words. The recovered QAM symbols, in conjunction with associated reference symbols, can be provided back to the demodulator 220 for further processing. Reference symbols, as used herein, refer to pilot symbols that are embedded in data traffic. Pilot symbols traditionally are used for channel estimation. With respect to the arrangements disclosed herein, pilot symbols can be used for channel estimation during the first processing pass. Subsequently, both the pilot symbols and recovered QAM data symbols can be used for channel estimation.

It should be appreciated that the demodulator 220, the de-interleave module 225, and the LDPC decoder 230 can be used to process a data stream whether or not the interleave module 235 and the QAM symbol recovery module 240 are enabled. For example, if the parity check of the LDPC decoder 230 fails after a predetermined number of iterations, the interleave module 235 and the QAM symbol recovery module 240 then can be enabled. The signal can be processed through the joint demodulation-decoding loop 250 and the LDPC decoder 230 again can attempt to successfully decode the signal as indicated by a successful parity check.

The joint demodulation-decoding loop 250 can be repeated a predetermined number of times. More particularly, the joint demodulation-decoding loop 250 can be performed once for each time a predetermined number of LDPC decoding iterations fail. The loop 250 can be exercised as discussed until such time that the LDPC parity check eventually passes or a predetermined number of iterations of the loop 250 is performed.

The architecture illustrated with reference to FIG. 2 can provide a total number of LDPC decoding iterations for a particular code word of $N_{LDPC} \times (N_{joint}+1)$, where $N_{LDPC}$ is the number of LDPC decoding iterations, i.e., loop 245, and $N_{joint}$ is the number of iterations of loop 250. Further, the architecture described herein reduces the computational complexity of the receiver 200, particularly when compared with conventional receivers that exercise processing loops for a predetermined number of times regardless of the success of signal decoding.

It may be the case that hard decisions of bits based on intermediate soft decisions from LDPC decoder 230 have a number of errors. This may be true, for example, in a data structure where the same tone of seven contiguous OFDM symbols are grouped to form a dwell with the middle symbol being used as a reference and where each dwell may be assigned to a different mobile station. As is known in the art, a dwell can be a minimum data unit that is formed by one tone in the frequency dimension and seven OFDM symbol intervals in the time dimension. As such, a dwell can have six QAM symbols as payload, with each QAM symbol occupying one tone and one OFDM symbol interval, and one reference symbol in the middle.

At the receiver, each dwell can be demodulated using channel estimation based on the reference symbol in the middle. This also may be true for low signal-to-noise-ratio operations. If so, the associated recovered QAM symbols likely contain many errors. While the dwell structure referenced above is used to describe the arrangements disclosed herein, it should be appreciated that arrangements disclosed herein also can be applied to other OFDM data structures including, but not limited to, IEEE 802.16, or the like.

In one arrangement, to mitigate error propagation, a technique for QAM symbol recovery can be implemented by QAM symbol recovery module 240 that is based upon ternary bits fed back from the LDPC decoder 230. The ternary bits can be generated by the following rule: $b_k=1$ when $LLR(b_k) \geq T$, $b_k=-1$ when $LLR(b_k) < -T$, and $b_k=0$ in all other cases. In the rule, $LLR(b_k)$ represents the soft decision of bit k, and T represents a preset threshold. Generally, only those detected bits with large confidence levels are used or accepted as accurate.

Figure 3:
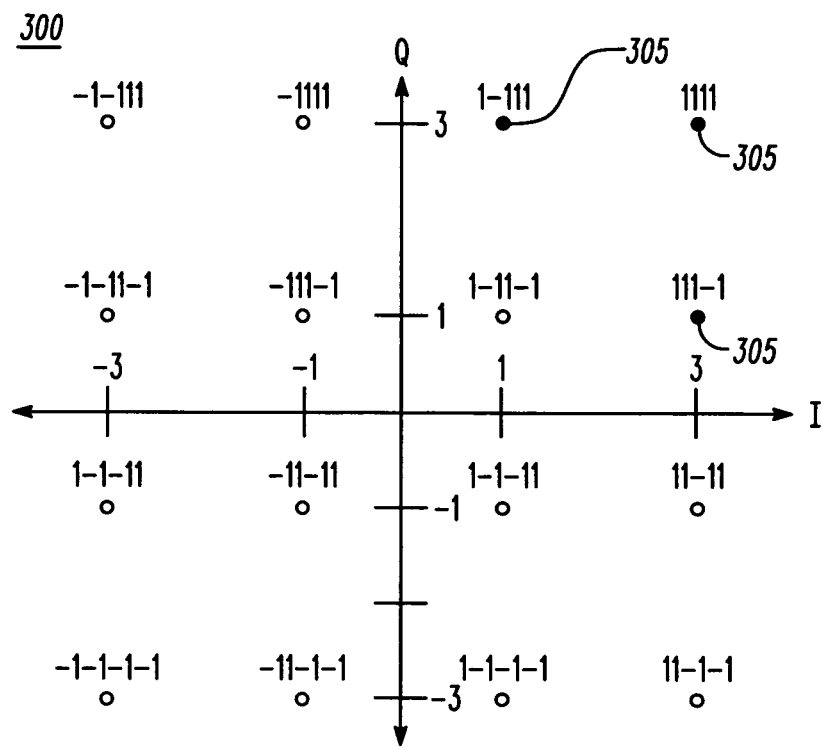
FIGS. 3-6 illustrate constellation diagrams which are useful for understanding the present invention.
Figure 4:
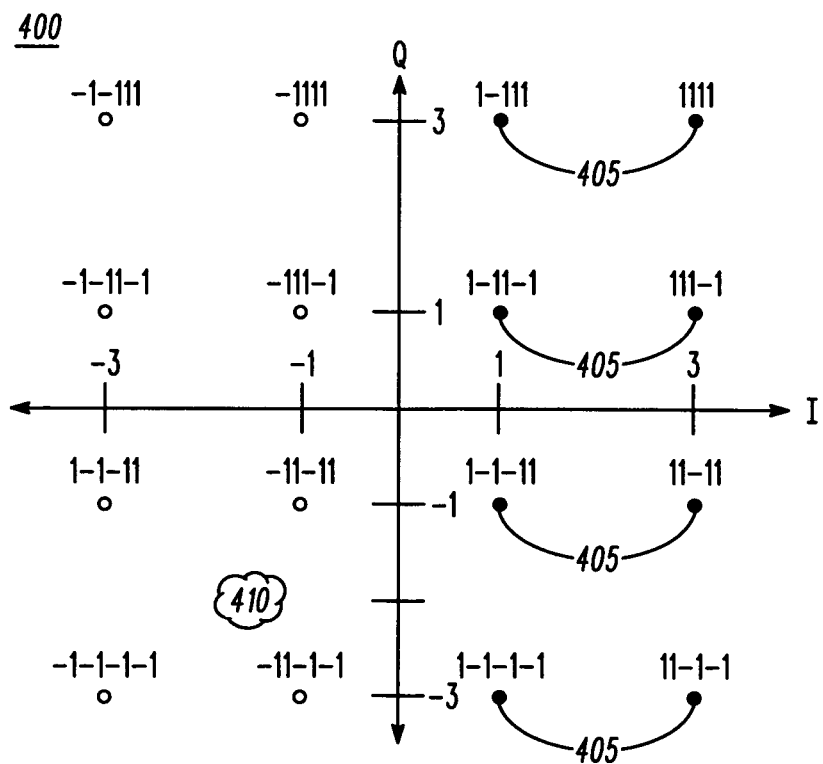

In illustration, consider a 16QAM represented by the constellation diagram 300 shown in FIG. 3. For purposes of illustration and simplicity, each 16QAM symbol 305 corresponds to a 4-bit group and the bit-to-symbol mapping rule is $s_I=2b_0+b_1$ and $s_Q=2b_2+b_3$, where a 16QAM symbol is defined as $s=s_I+js_Q$. If a 4-bit group formed by the ternary bits from the LDPC decoder 230 does not contain zero, the associated 16QAM symbol can be recovered by the QAM symbol recovery module 240 by the mapping rule. If, however, one or more of the bits are zero, for example, $b_k=1$ and $b_{k+1}=b_{k+2}=b_{k+3}=0$ for the kth 16QAM symbol, the associated kth 16QAM symbol can be recovered by QAM symbol recovery module 240 by slicing the corresponding soft 16QAM symbol using a slicer defined by the constellation diagram 400 shown in FIG. 4, which 16QAM symbol is stored in the QAM symbol recovery module 240 or the demodulator 220 as a result from a previous pass,. In general, a slicer determines the closest point in a constellation to an estimated point.

Figure 5:
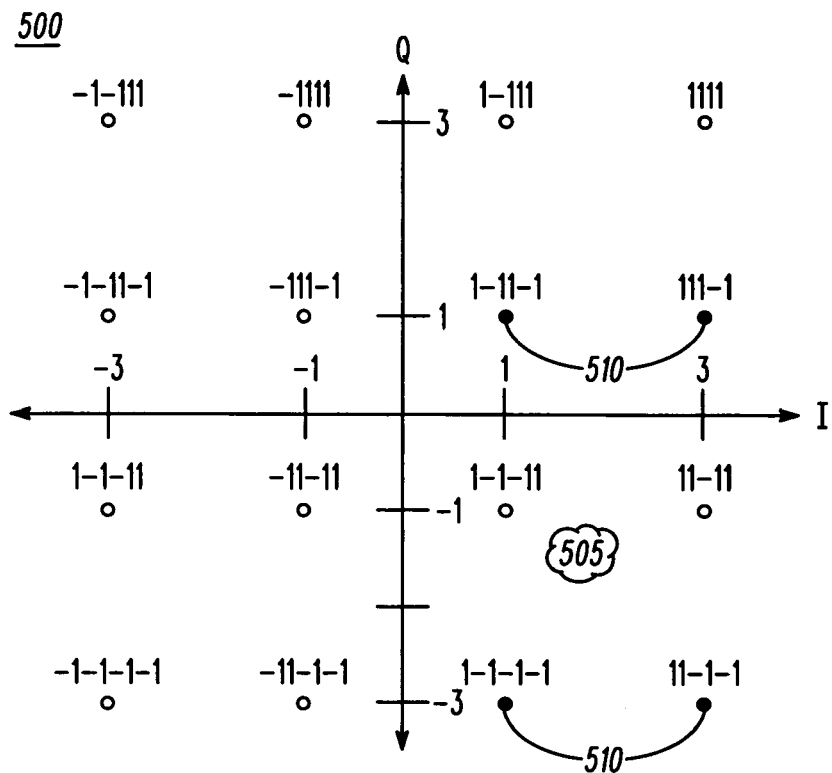
Figure 6:
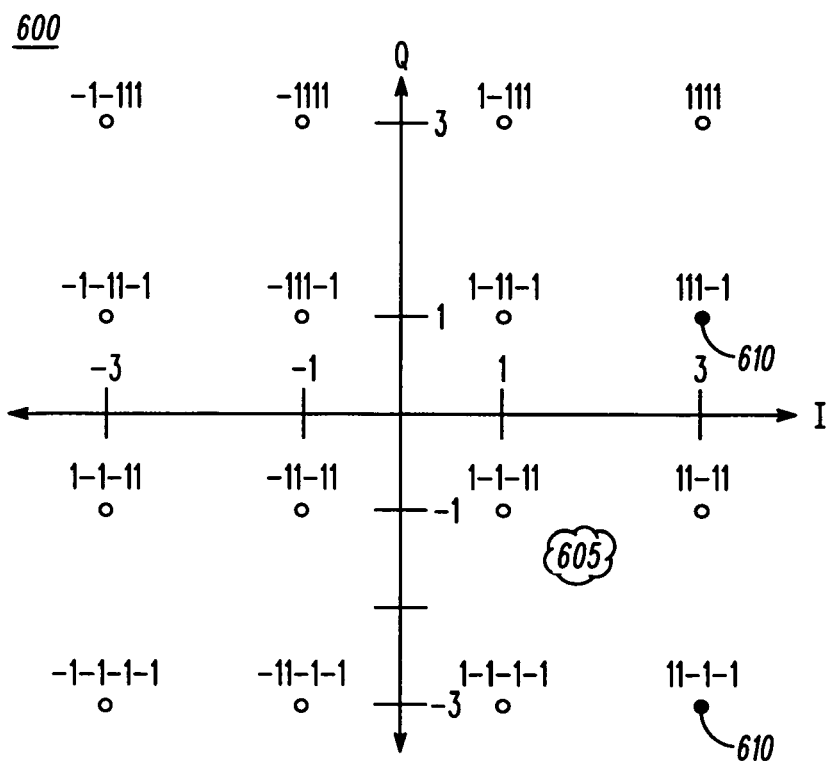

Recovered QAM symbols are limited to constellation points 405. The recovered 16QAM symbol, corresponding to the soft symbol 410, based on LDPC decoder feedback is (1−j3) rather than (−1−j3) were a full 16QAM slicer to be used. Furthermore, if $b_k=1$, $b_{k+3}=-1$, and $b_{k+1}=b_{k+2}=0$, a slicer applied by QAM symbol recovery module 240 would instead be defined by the constellation diagram 500 as shown in FIG. 5. The resulting hard 16QAM would be (3−j3) instead of (3−j) for soft symbol 505 since interpretation, or slicing, of soft symbol 505 by the QAM symbol recovery module 240 would be limited to constellation points 510. If $b_k=1$, $b_{k+1}=1$, and $b_{k+3}=-1$, while $b_{k+2}=0$, the slicer applied by QAM symbol recovery module 240 would instead be defined by the constellation diagram 600 of FIG. 6. The recovered 16QAM symbol would be (3−j3) instead of (1−j) for soft symbol 605 since interpretation of soft symbol 605 would be limited to constellation points 610. This technique can be more beneficial when recovering QAM symbols of higher order QAM modulations such as 64QAM and 256QAM.

After all QAM symbols for data are recovered, the QAM symbols can be used in a second pass through loop 250 as reference symbols for channel estimation. In one arrangement, during a first demodulation pass through loop 250, one-tap equalizer coefficients can be determined by the channel estimate based on the reference symbol in the middle of the dwell. The coefficients can be used for all 6 data symbols in the same dwell. During a second demodulation pass through loop 250, the equalizer coefficients can be calculated based on the reference symbol and applied to all 6 recovered data symbols. The averaged value is applied to all 6 data symbols during the second pass equalization. The equalization is performed by an equalization function, that is, a channel estimation function, included in the demodulator 220, which equalization function removes the amplitude and phase variations resulting from a fading environment. Equalization is performed on every pass through the demodulator 220. The loop 250 may then be iterated as many times as a designer of receiver 200 desires in order to get a better and better recovered frame.

The averaged value can be a simple average, a mean, or a weighted mean. That is, the equalizer coefficient for ith tone over a particular dwell can be expressed as $$C_i = \frac{1}{7}\sum_{k=1}^{7} \frac{s_{i,i}}{\tilde{s}_{i,k}} \text{ or } C_i = \frac{1}{\sum_k w_k}\sum_{k=1}^{7} w_k \frac{s_{i,i}}{\tilde{s}_{i,k}}.$$

Accordingly, $s_{i,k}$ and $\tilde{s}_{i,k}$ are QAM symbols and associated soft symbols in a given dwell respectively. The middle QAM symbol is the known reference and the remaining QAM symbols are recovered data symbols. $w_k$ is a weight applied to the associated estimate. The value of $w_k$ depends upon the ternary bit values for the associated QAM symbol. For example, in case of 16QAM, $w_k$ may be 1, 0.75, 0.5, 0.25, and 0 corresponding to the feedback 4-bit group which has 0, 1, 2, 3, and 4 zeros.

As known, OFDM communication systems may suffer both FFT-leakage, in reference to interference among tones, and phase rotation, in the case of Doppler shift and frequency error. A one-tap equalizer can compensate the phase error in an effort to mitigate the impact of frequency error. As such, the one tap-equalizer coefficient can be phase adjusted over one dwell based on estimated frequency error or Doppler shift. This frequency error estimate can be performed based upon reference symbols and recovered QAM data symbols.

For example, if $\Delta\phi$ represents the relative phase difference of two adjacent QAM symbols along the same tone index, the frequency error estimate for one mobile station can be expressed as $$\Delta f = \frac{1}{2\pi M T_{OFDM}} \sum_{k=1}^{M} \Delta\varphi_k.$$

Here, M represents the total number of phase differences of a mobile station over multiple dwells and tones. The relative phase difference can be calculated along the same tone for different OFDM symbol indices. $T_{OFDM}$ represents one OFDM symbol time interval. In the estimate, all recovered data QAM symbols are used as "reference symbols." Also, the weighted average can be used for frequency error estimation in the same manner as described previously. The phase adjustment of the one tap equalizer coefficient for different data symbol positions in a given dwell then can be determined based upon Δf and the relative position of the interested data symbol to the reference symbol. For example, $\Delta\Phi_k=(4-k)2\pi T_{OFDM}\Delta f$, where k=1, 2, 3, 4, 5, 6, and 7 and where k denotes the data symbol position in a dwell and $\Delta\Phi_k$ denotes a phase error for each of the seven symbols of the dwell, based on a a frequency error of Δf.

Figure 7:
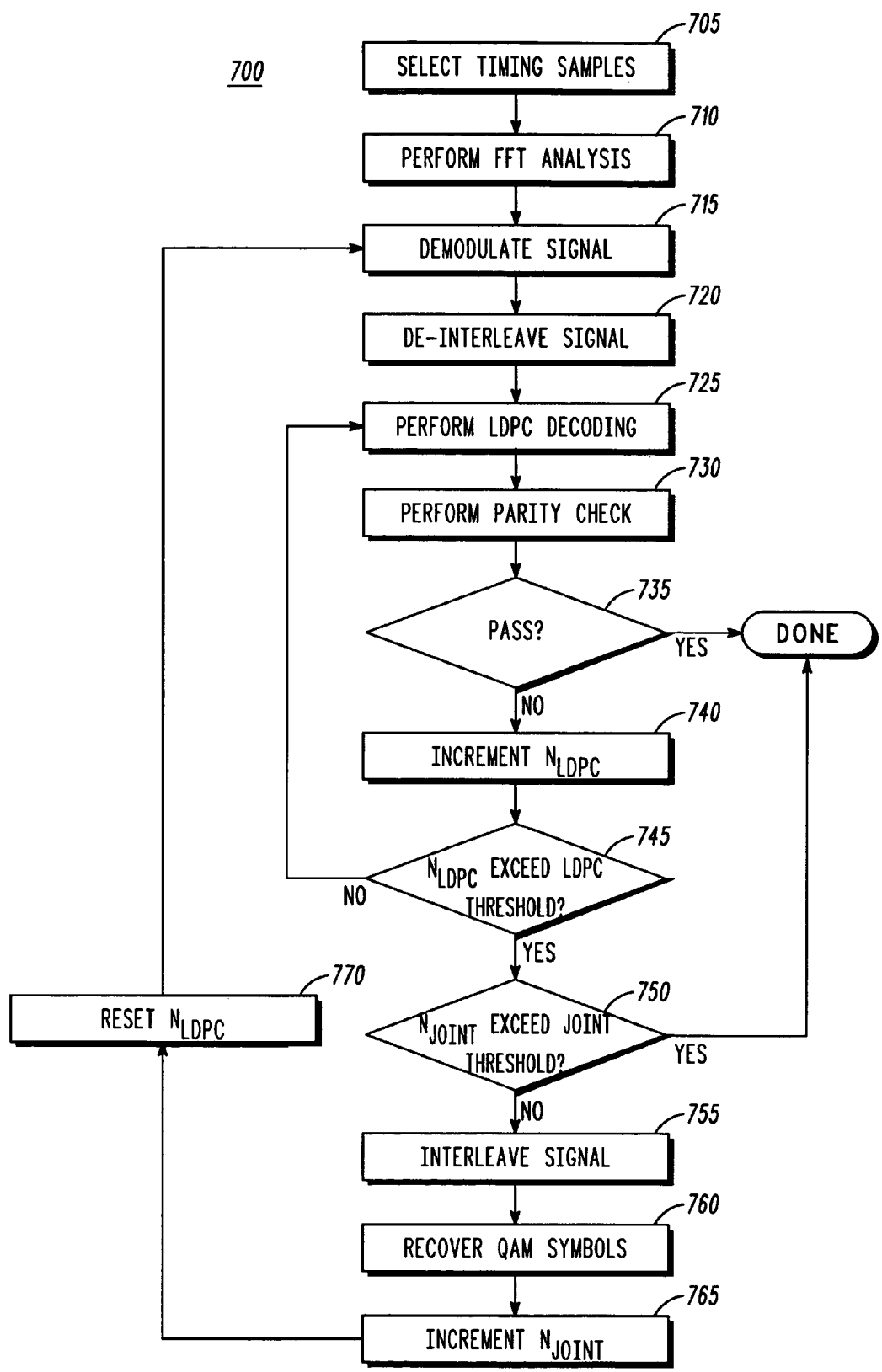
FIG. 7 is flowchart depicting a method of processing signals in an OFDM communication system that is useful for understanding the present invention.

FIG. 7 is flowchart depicting a method 700 of processing signals in an OFDM communication system that is useful for understanding the present invention. Method 700 can be implemented using an OFDM receiver, for example, receiver 200 illustrated with reference to FIG. 2. Method 700 can begin in a state where a wireless signal has been received within the OFDM receiver and converted into a digital representation. Further, the counters within the OFDM receiver, to be discussed herein, can be initialized.

Accordingly, at step 705, one or more timing samples can be selected for processing from the digitized signal. In step 710, the signal can be processed by performing an FFT analysis. In step 715, the signal can be demodulated. As noted, along with demodulation, other functions such as channel estimation, equalization, AFC, and bit LLR generation also can be performed upon the signal.

In step 720, the signal can be de-interleaved. In step 725, an LDPC decoding iteration is performed upon the signal. In step 730, a parity check can be performed. In step 735, the result(s) of the parity check can be evaluated. If the parity check was passed, the method can end as the received signal was successfully decoded. If not, the method can proceed to step 740. At step 740 a counter, $N_{LDPC}$, of LDPC decoding iterations having failed parity checks can be incremented. Referring to decision box 745, the value of the counter $N_{LDPC}$ can be compared with a threshold value. If the counter $N_{LDPC}$ exceeds the threshold value, the method can proceed to decision box 750. If not, the method can loop back to step 725 to perform further LDPC decoding iterations. It should be appreciated that in one aspect the threshold value can be determined according to, or defined as, the number of iterations in a given LDPC decoding attempt. Thus, when the number of LDPC decoding iterations constituting an attempt or a plurality of attempts fails, the method can proceed to step 750.

Referring to decision box 750, a determination can be made as to whether the number of iterations of the joint demodulation-decoding loop, as monitored by counter $N_{joint}$, exceeds a second threshold. If so, the method can end unsuccessfully. If $N_{joint}$ does not exceed the second threshold, the method can proceed to step 755 where the signal can be interleaved. In step 760, QAM symbols can be recovered from the signal. In step 765, the value of counter $N_{joint}$ can be incremented and in step 770 the counter $N_{LDPC}$ can be reset. The method then can loop back to step 715 to continue processing.

By OFDM receiver 200 utilizing LDPC codes and further utilizing an LDPC decoding loop that is nested within a larger joint demodulation-decoding loop, the receiver is able to provide a better channel estimate than the OFDM receiver of the prior art. The joint demodulation-decoding loop can be selectively enabled based upon the number of LDPC decoding iterations having failed parity checks. In other words, the OFDM receiver 200 utilizes added information about received data symbols, provided from the forward error correction layer on the data bits, along with a method to estimate "confidence" in these data bits so as to not use a data bit that is in error. The receiver then uses these data bits to provide a better channel estimate. This process then can be repeated in an iterative fashion. The end result is better channel error performance.

The present invention can be realized in hardware, software, or a combination of hardware and software. The present invention can be realized in a centralized fashion in one processing system or in a distributed fashion where different elements are spread across several interconnected processing systems. Any kind of processing system or other apparatus adapted for carrying out the methods described herein is suited. A typical combination of hardware and software can be a processing system with a computer program that, when being loaded and executed, controls the processing system such that it carries out the methods described herein. The present invention also can be embedded in an application product, which comprises all the features enabling the implementation of the methods described herein, and which when loaded in a processing system is able to carry out these methods.

The terms "computer program," "software," "application," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, an application can include, but is not limited to, a subroutine, a function, a procedure, an object method, an object implementation, an executable application, an applet, a servlet, a source code, an object code, a shared library/dynamic load library and/or other sequence of instructions designed for execution on a processing system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically, i.e. communicatively linked through a communication channel or pathway.

This invention can be embodied in other forms without departing from the spirit or essential attributes thereof. Accordingly, reference should be made to the following claims, rather than to the foregoing specification, as indicating the scope of the invention.

What is claimed is:

1. A method of signal processing in an Orthogonal Frequency Division Multiplexing receiver comprising:
   performing at least one Low-Density Parity Check (LDPC) decoding attempt on a received signal;
   evaluating at least one parity check for each LDPC decoding attempt;
   counting failed LDPC decoding attempts according to the evaluated parity checks; and
   selectively processing the signal through at least one joint demodulation-decoding loop based on the counting of failed LDPC decoding attempt, wherein selectively processing the signal further comprises receiving a LDPC decoder output as feedback within the joint demodulation-decoding loop and performing further symbol recovery on the fed back signal.

2. The method of claim 1, further comprising, after a first LDPC decoding attempt, determining at least one bit of the signal having a confidence level exceeding a predefined threshold and limiting available symbols for use in symbol recovery according to the determining of at least one bit.

3. The method of claim 1, wherein the selective processing of the signal further comprises:
   comparing the failed parity check count with a threshold value; and
   if the failed parity check count exceeds the threshold value, processing the signal through the at least one joint demodulation-decoding loop.

4. The method of claim 1, wherein the selective processing of the signal further comprises processing the signal through the joint demodulation-decoding loop each time a predetermined number of failed LDPC decoding attempts is performed.

5. The method of claim 1, wherein the selective processing further comprises:
   interleaving a processed signal comprising soft decisions of whole code word bits; and
   recovering Quadrature Amplitude Modulation (QAM) symbols from the interleaved signal.

6. The method of claim 1, wherein the selective processing further comprises:
   reducing a number of possible points in a QAM constellation according to the feedback.

7. The method of claim 6, wherein the performing of at least one LDPC decoding attempt further comprises generating ternary bits having values of −1, 0, or 1 according to the polarity and magnitude of a soft decision, wherein the feedback comprises, at least in part, the ternary bits.

8. The method of claim 7, wherein the selective processing further comprises reducing the number of possible points in a QAM constellation by half for each non-zero ternary bit.

9. An Orthogonal Frequency Division Multiplexing (OFDM) receiver comprising:
   a pre-processor that performs a frequency analysis upon selected samples of a received signal;
   a forward processing stage that demodulates the received signal and performs iterative Low-Density Parity-Check (LDPC) decoding on the received signal; and
   a feedback processing stage that selectively processes the signal through at least one joint demodulation-decoding loop according to whether a parity check performed in the first processing stage is passed, wherein selectively processing the signal further comprising receiving the LDPC decoded signal and feeds the decoded signal back within the joint demodulation-decoding loop and performing further symbol recovery on the fed back signal.

10. The OFDM receiver of claim 9, wherein the forward processing stage further comprises:
    a demodulator that determines soft symbols as output;
    a de-interleave module that de-interleaves the received signal; and
    an LDPC decoder that iteratively decodes the received signal until a predetermined number of iterations, with each iteration having a failed parity check, is performed or a parity check is passed.

11. The OFDM receiver of claim 10, wherein the LDPC decoder counts the number of LDPC decoding iterations associated with a failed parity check and compares the number with an LDPC decoding iteration limit.

12. The OFDM receiver of claim 10, wherein the feedback processing stage further comprises:
    an interleave module that interleaves an output signal from the LDPC decoder, wherein the output signal comprises soft decisions of whole code word bits; and
    a QAM symbol recovery module that provides hard symbols back to the demodulator, wherein the first and second processing stages comprise a joint demodulation-decoding loop.

13. The OFDM receiver of claim 12, wherein the LDPC decoder generates ternary bits having values of −1, 0, or 1 according to the polarity and magnitude of a soft decision and the QAM symbol recovery module limits available symbols for use in symbol recovery according to the ternary bits.

14. A machine readable storage having stored thereon a computer program having instructions for executing the method of claim 1.

* * * * *

UNITED STATES PATENT AND TRADEMARK OFFICE
CERTIFICATE OF CORRECTION

PATENT NO. : 7,590,186 B2  Page 1 of 1
APPLICATION NO. : 11/388061
DATED : September 15, 2009
INVENTOR(S) : Yu et al.

It is certified that error appears in the above-identified patent and that said Letters Patent is hereby corrected as shown below:

On the Face Page, in Field (75), under "Inventors", in Column 1, Line 1, delete "Xiaonyong," and insert -- Xiaoyong --, therefor.

Signed and Sealed this

Eighth Day of June, 2010

David J. Kappos
*Director of the United States Patent and Trademark Office*